(12) United States Patent
Yamasaki et al.

(10) Patent No.: US 6,388,491 B1
(45) Date of Patent: May 14, 2002

(54) DELAY CIRCUIT

(75) Inventors: Koichi Yamasaki; Hiroshi Mukainakano, both of Chiba (JP)

(73) Assignee: Seiko Instruments Inc. (JP)

( * ) Notice: Subject to any disclaimer, the term of this patent is extended or adjusted under 35 U.S.C. 154(b) by 0 days.

(21) Appl. No.: 09/299,469

(22) Filed: Apr. 26, 1999

(30) Foreign Application Priority Data

Apr. 28, 1998 (JP) ............................................. 10-119648

(51) Int. Cl.⁷ ................................................ H03H 11/26
(52) U.S. Cl. ......................... 327/283; 327/278; 327/285
(58) Field of Search ................................ 327/276, 277, 327/283, 284, 285, 290, 393

(56) References Cited

U.S. PATENT DOCUMENTS

| | | | | |
|---|---|---|---|---|
| 3,831,113 A | * | 8/1974 | Ahmed ........................ | 331/111 |
| 3,979,598 A | * | 9/1976 | Lach ............................ | 327/276 |
| 5,006,738 A | * | 4/1991 | Usuki et al. ................. | 307/594 |
| 5,650,739 A | * | 7/1997 | Hui et al. .................... | 327/262 |
| 5,969,557 A | * | 10/1999 | Tanzawa et al. ............ | 327/291 |

* cited by examiner

Primary Examiner—Kenneth B. Wells
Assistant Examiner—Cassandra Cox
(74) Attorney, Agent, or Firm—Adams & Wilks

(57) ABSTRACT

A delay circuit includes a capacitor, a charging/discharging control circuit receptive of an input signal for controlling at least one of the charging and the discharging of the capacitor to set a delay time in accordance with a capacitance value of the capacitor, and a comparing circuit for comparing a voltage at a first terminal of the capacitor with a first reference voltage to produce an output signal which becomes inverted after the delay time when the voltage at the first terminal of the capacitor crosses over the first reference voltage during one of charging and discharging of the capacitor, and comparing a voltage at the first terminal of the capacitor with a second reference and producing an output signal which becomes inverted when the voltage at the first terminal of the capacitor is higher than the second reference voltage so that the delay time is reduced when the first terminal of the capacitor becomes short-circuited to an abnormally high voltage level.

19 Claims, 9 Drawing Sheets

DELAY CIRCUIT

BACKGROUND OF THE INVENTION

The present invention relates of a delay circuit using charging/discharging of a capacitor and to a device using the delay circuit.

An example of a conventional delay circuit using charging/discharging of a capacitor is shown in FIG. 2. First, the operation of this delay circuit will be described.

At an initial state, since a switch 1 is turned ON (closed) and a switch 2 is turned OFF (opened), a terminal A to which a capacitor 7 is connected has a potential of (V1−V2). In order to start the operation of this delay circuit, a signal is supplied to an input terminal 11. When the signal enters the input terminal 11, a control circuit 8 turns OFF the switch 1 and turns ON the switch 2. A constant current source 12 is connected to the terminal A, and the electric charge of the capacitor 7 also connected to the terminal A is discharged.

When the potential of the terminal A reaches a potential V3 of a reference voltage 5, the output of a comparator 9 is inverted. Since it takes some time to discharge, this circuit is used as a delay circuit. Here, a time from the start of the operation of the control circuit 8 to the inversion of the output of the comparator 9 becomes a delay time.

This operation is shown in FIG. 3. The horizontal axis indicates time, and the vertical axis indicates voltage. At the initial state, although the potential at the terminal A in FIG. 2 is (V1−V2), the capacitance is discharged through constant current from a time ta when the signal is supplied to the input terminal 11, so that the potential at the terminal A is lowered. Thereafter, when the potential at the terminal A reaches the potential V3 of the reference voltage 5, the output voltage of the comparator is inverted.

When a capacitance value of the capacitor 7 is C0, and a constant current value of the constant current source 12 is I0, a delay time T0 may be represented by the following Equation 1:

$$T0 = C0 \times (V1 - V2 - V3) \times I0 \qquad \text{[Equation 1]}$$

When the capacitance value C0 is made large or the constant current value I0 is made small, the delay time can be extended. On the other hand, when the capacitance value C0 is made small or the constant current value I0 is made large, the delay time can be shortened.

In the case of the delay circuit using charging/discharging of the capacitor shown in FIG. 2 as the prior art, there are problems as described below.

In the delay circuit described thus far, a problem occurs when the terminal A to which the capacitor 7 is connected is short-circuited to an abnormal voltage such as the potential V1. In the case where the terminal A to be connected to the capacitor 7 comes to have a voltage higher than (V1−V2), the inverted input terminal of the comparator 9 does not become lower than V3. Thus, the output of the comparator 9 is not inverted. This means that the delay is not realized, and the delay time is extended without limit. FIG. 4 shows potentials at this time. The terminal A to which the capacitor 7 is connected, is connected in an abnormal state and has the potential V1. Thus, the voltage at the terminal A is always at the potential V1, and the output of the comparator 9 is not inverted.

This delay circuit is also used as a protecting circuit or an erroneous operation preventing circuit. For example, in a lithium ion battery, when a voltage becomes too high, there is a risk that it may cause a fire. Thus, an overcharge preventing circuit is provided. The delay circuit can also be used for the overcharge preventing circuit. In addition a delay circuit is also used in a charger for lithium ion batteries to set a charging time (charge stop circuit) and the like. Thus, when the terminal A to which the capacitor 7 is connected as shown in FIG. 1 is short-circuited to a voltage higher than (V1−V2), the overcharge preventing circuit or the charge stop circuit does not work, and a very dangerous state occurs. If the delay of the charger does not work, charging is continues permanently, and heat generation of the charger and the lithium ion battery is advanced. This causes a very dangerous state such that a fire or heat generation of the apparatus may occur.

In a circuit provided for protection or improvement of safety, even if a problem occurs, some protection must work. A so-called fail-safe must be realized. In the case of the present invention, it is required that even if the delay time is shortened, an output voltage is inverted and a signal is transmitted to the outside.

SUMMARY OF THE INVENTION

In a delay circuit using charging/discharging of a capacitor to set a delay time, there is added a voltage detecting circuit for detecting whether a terminal voltage of the capacitor has exceeded a predetermined voltage range.

DETAILED DESCRIPTION

In a delay circuit using charging/discharging of a capacitor to set a delay time, a voltage detecting circuit for detecting whether a terminal of the capacitor has exceeded a voltage range in which charging/discharging is performed, is added so that the delay time is completed without fail.

Figure 1:
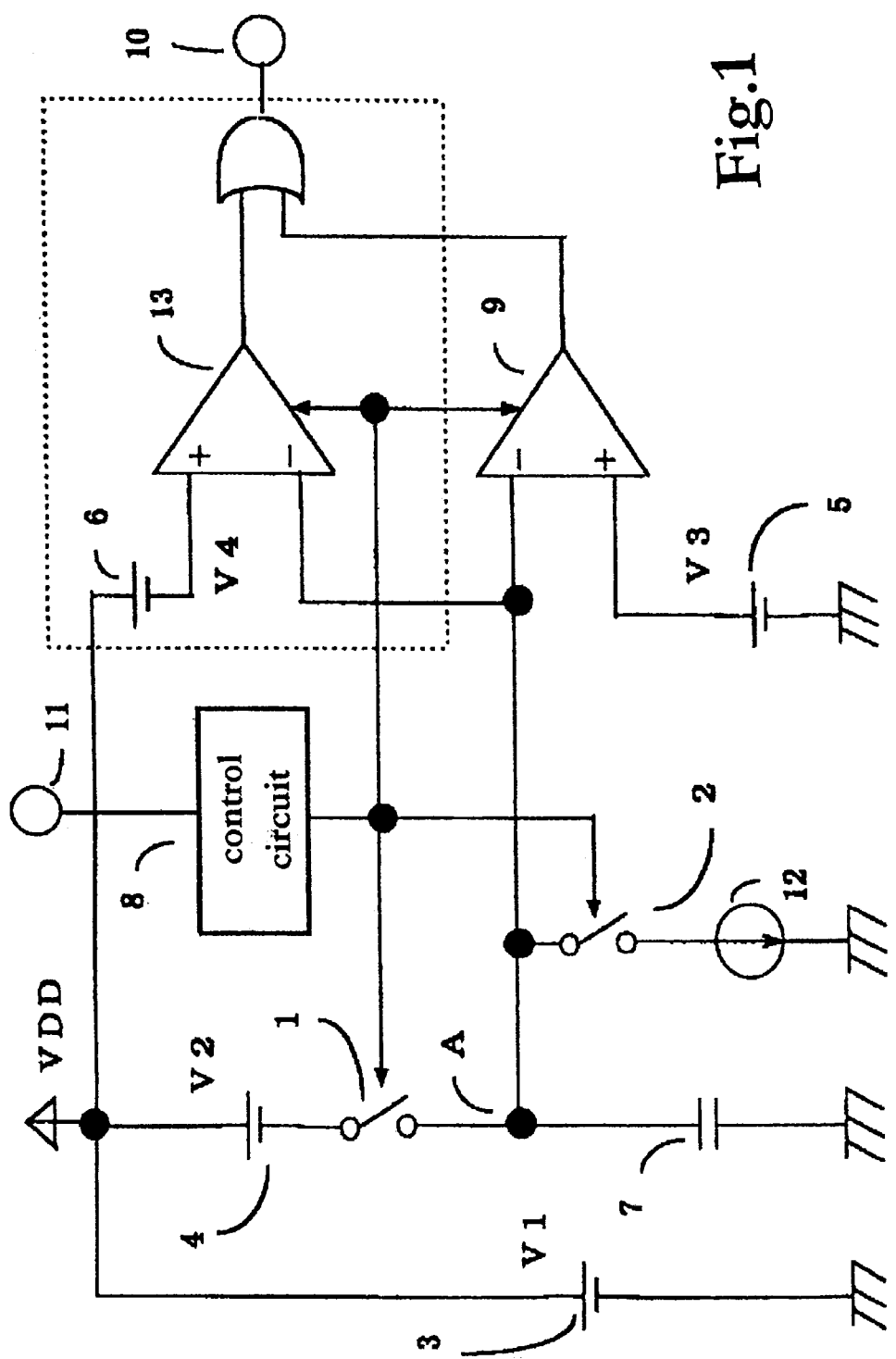
FIG. 1 is an explanatory view showing an embodiment of a delay circuit of the present invention.
Figure 2:
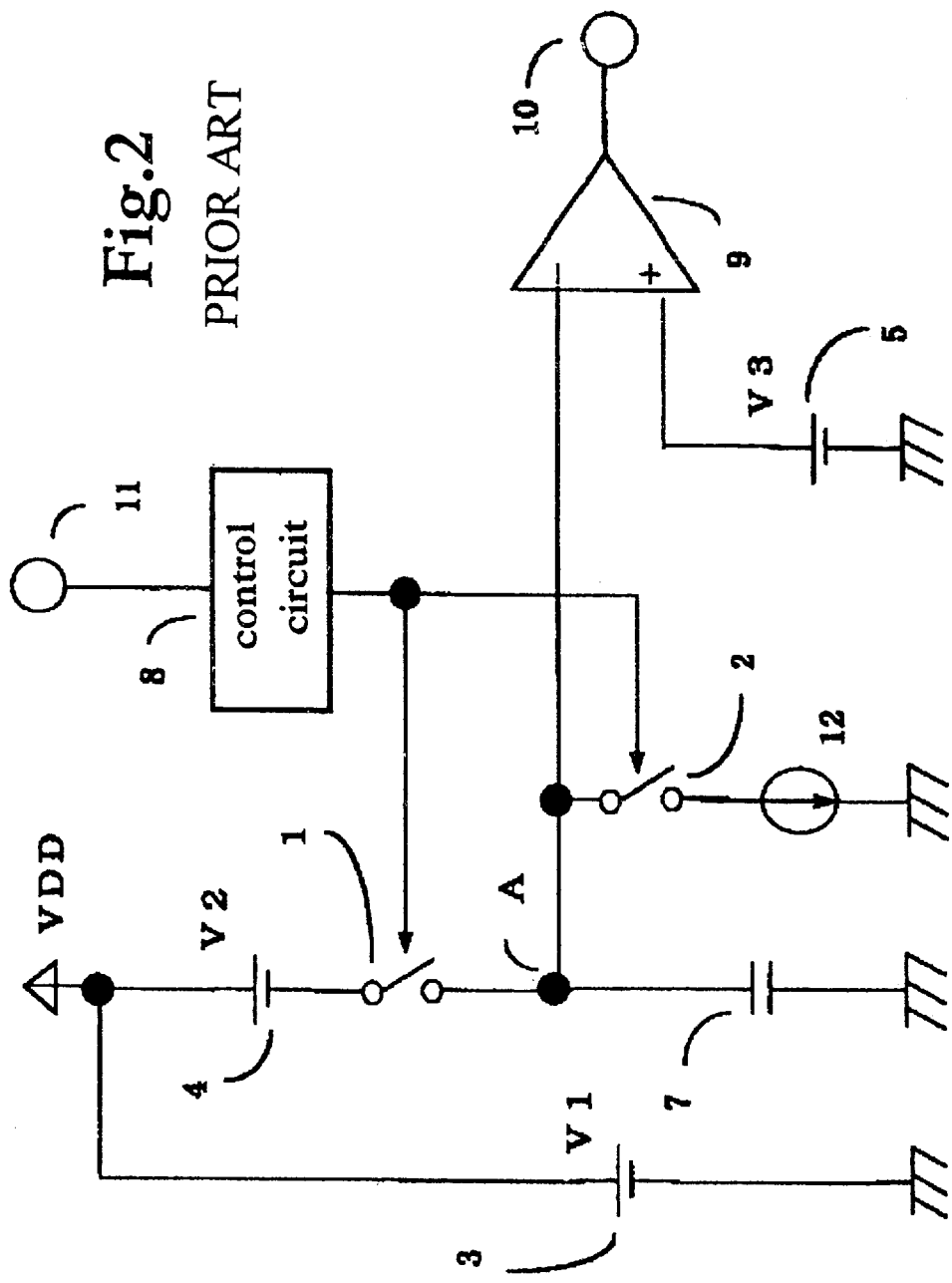
FIG. 2 is an explanatory view showing a conventional delay circuit.

An embodiment of this is shown in FIG. 1 and the operation of this delay circuit will be described.

At an initial state, a switch 1 is turned ON (closed), and a switch 2 is turned OFF (opened). A terminal A to which a capacitor 7 is connected has a potential obtained by subtracting a potential V2 of a reference voltage 4 from a potential V1 of a power source voltage 3 in advance. In order to start the operation of this delay circuit, a signal is supplied to an input terminal 11. When the signal enters the input terminal 11, a control circuit 8 turns OFF the switch 1 and turns ON the switch 2. It is assumed that comparators 9 and 13 are always turned ON. A constant current source 12 is connected to the terminal A, and the capacitance 7 also connected to the terminal A is discharged.

When the potential of the terminal A reaches a potential V3 of a reference voltage 5, the output of the comparator 9 is inverted. Since it takes some time to discharge, this circuit can be used as a delay circuit. Here, the time from the start of the operation of the control circuit 8 to the inversion of the output of the comparator 9 becomes a delay time.

When the capacitance of the capacitor 7 is C0, and the constant current value of the constant current source 12 is I0, the delay time T0 may be represented by the following Equation 2:

$$T0 = C0 \times (V1 - V2 - V3) \times I0 \qquad \text{[Equation 2]}$$

Figure 3:
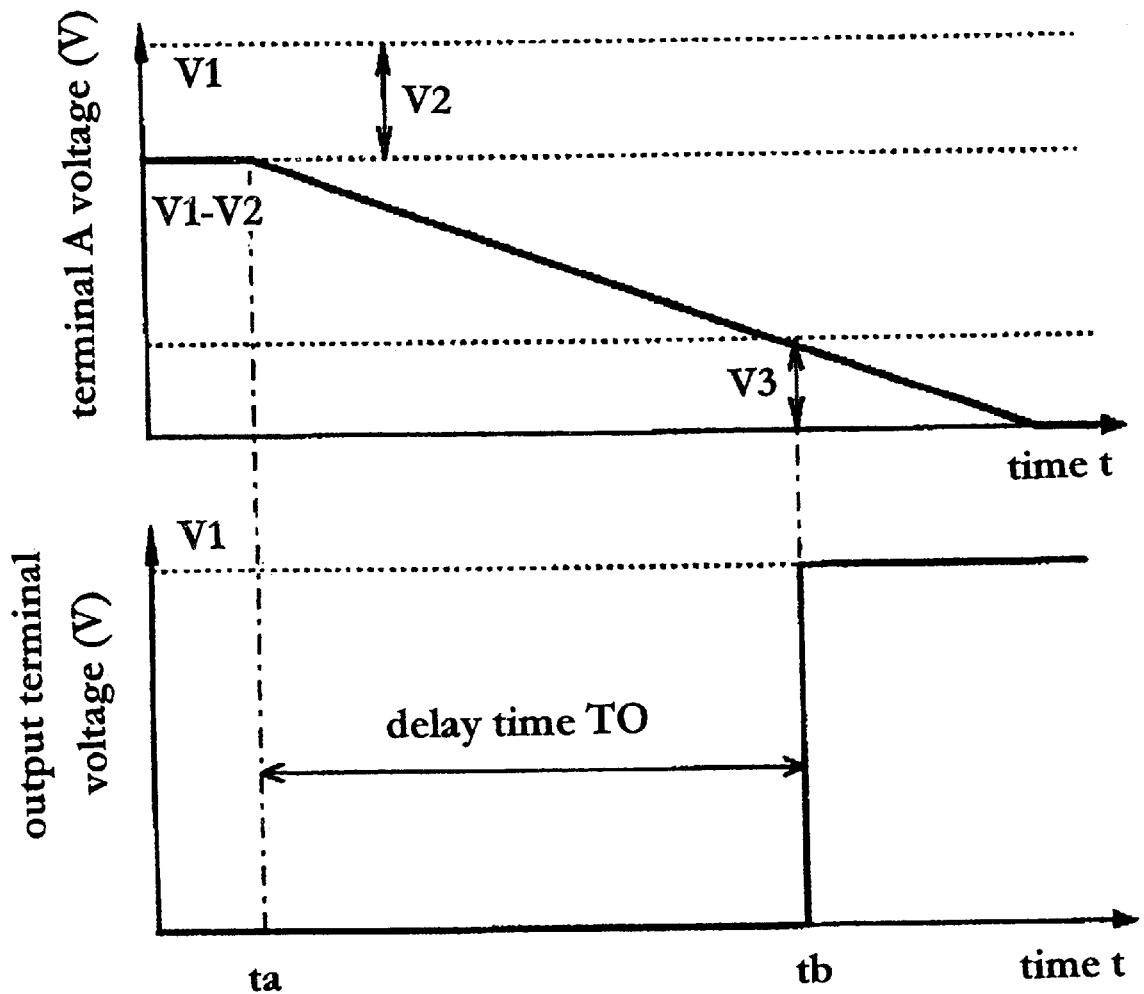
FIG. 3 is an explanatory view showing the state change of the conventional delay circuit.
Figure 4:
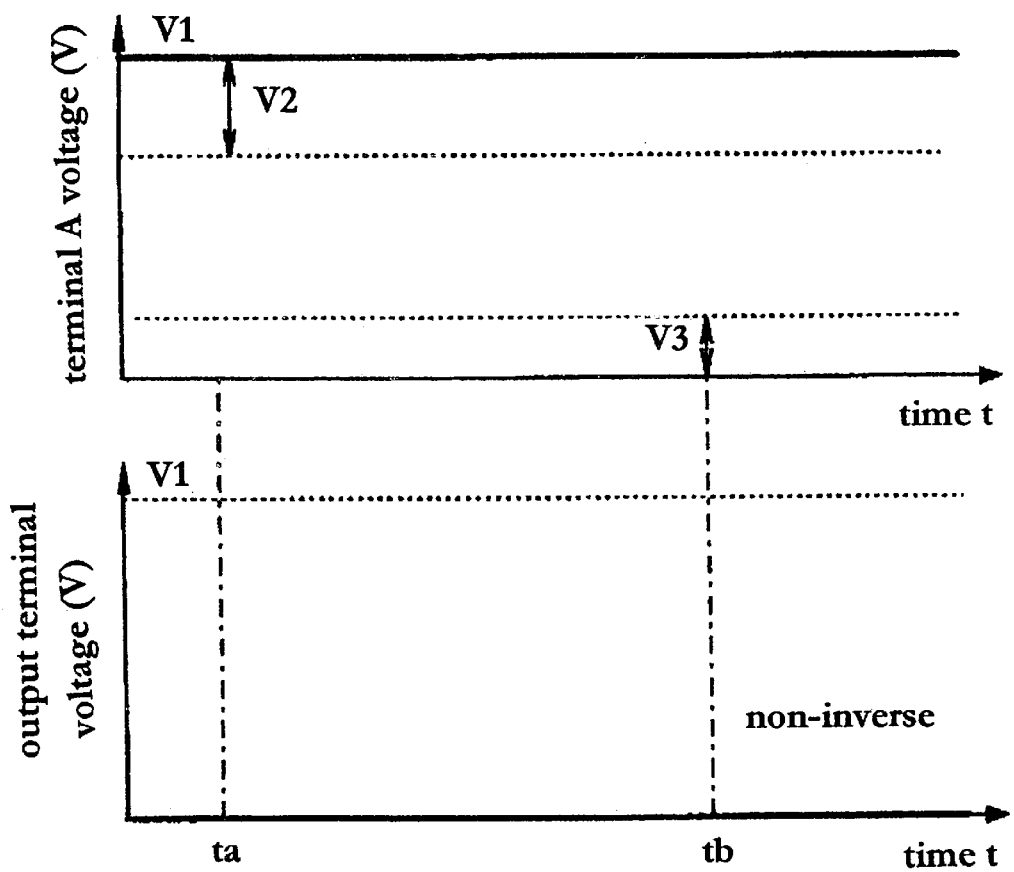
FIG. 4 is an explanatory view showing the state change of the conventional delay circuit.

Voltage changes at the terminal and the output terminal become the same as those illustrated in FIG. 3.

Figure 5:
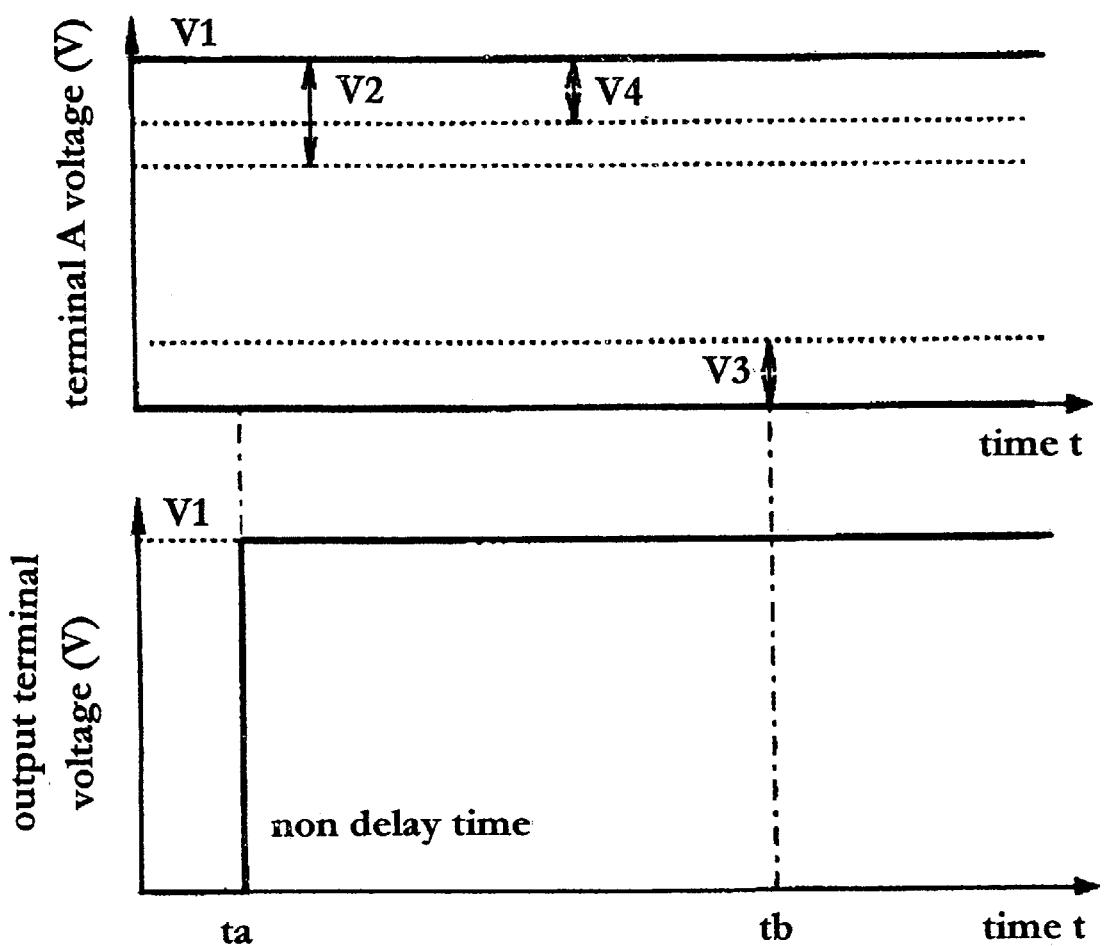
FIG. 5 is an explanatory view showing the state change of an embodiment of a delay circuit of the present invention.

Now, consider a case of abnormal operation in which the connection between the capacitor 7 and the terminal A is opened by an external factor. In such an open state, at the same time as the operation of the control circuit 8, the potential at the terminal A is lowered by the constant current source 12, and the inverted input terminal of the comparator 9 becomes V3 of less. By this, the output of the comparator 9 is inverted in a state where there is little delay time. Even in the case where the terminal A to which the capacitor 7 is connected, is short-circuited to an improper wiring line such as by being connected to a ground potential by an external factor, when the control circuit 8 is operated, since the voltage of the terminal A is V3 or less, the output of the comparator 9 is inverted in a state where there is little delay time, and safety is increased. This is shown in FIG. 5.

On the other hand, there is a case where the terminal A to which the capacitor is connected, is connected to an abnormal voltage such as a potential higher than (V1−V2) by an external factor. In the prior art, in this case, the output terminal voltage is not inverted permanently. In the embodiment of the present invention, this is improved. That is, when the terminal A is connected to a potential V4 higher than (V1−V2), the output voltage is inverted in a state where there is little delay time, and safety is increased.

As specific example, a case where the capacitor 7 is short-circuited to the potential V1 of the power source will be described.

Figure 6:
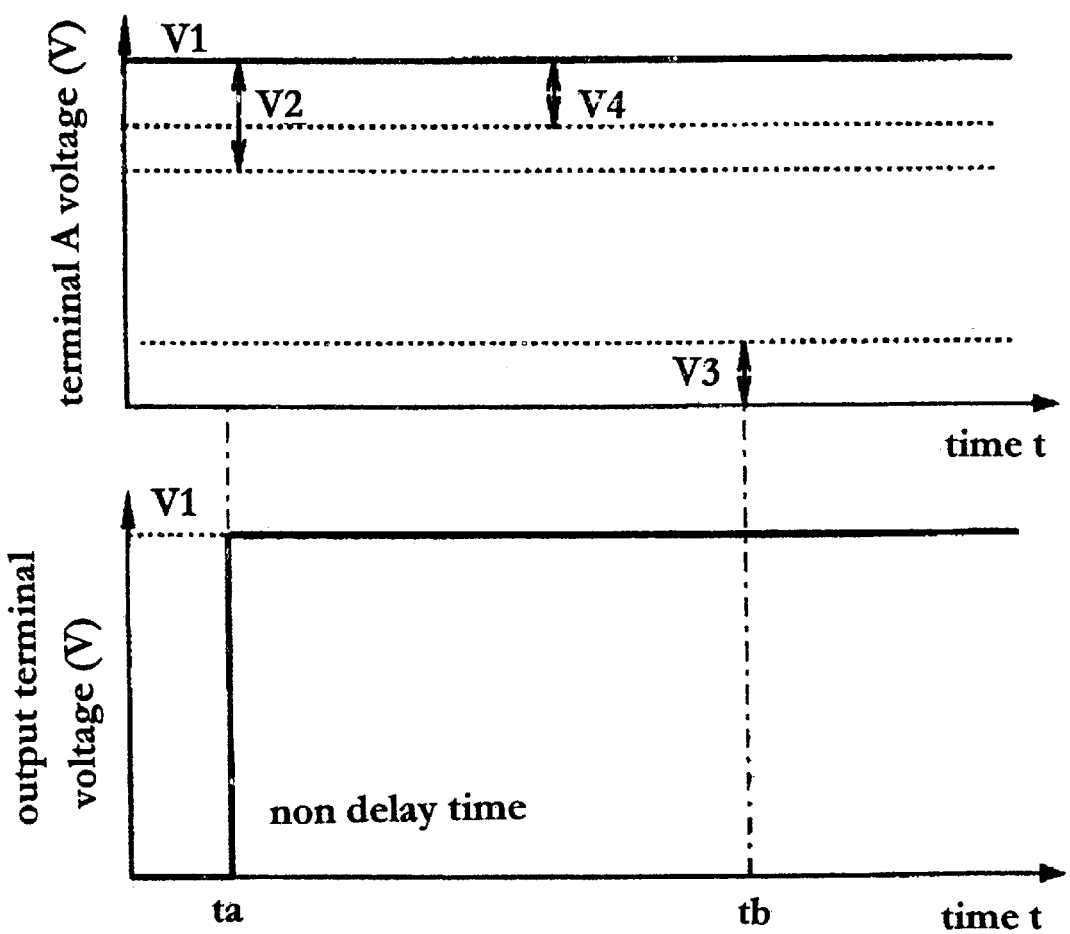
FIG. 6 is an explanatory view showing the state change of the embodiment of the delay circuit of the present invention.

In this state, when the control circuit 8 starts to operate, since the potential of the terminal A becomes higher than V4 and higher than (V1−V2), the output of the comparator 13 provided in the present invention is inverted. In the state described thus far, there is little delay time and the output voltage of the comparator is inverted. The voltage changes in this example are shown in FIG. 6.

Figure 7:
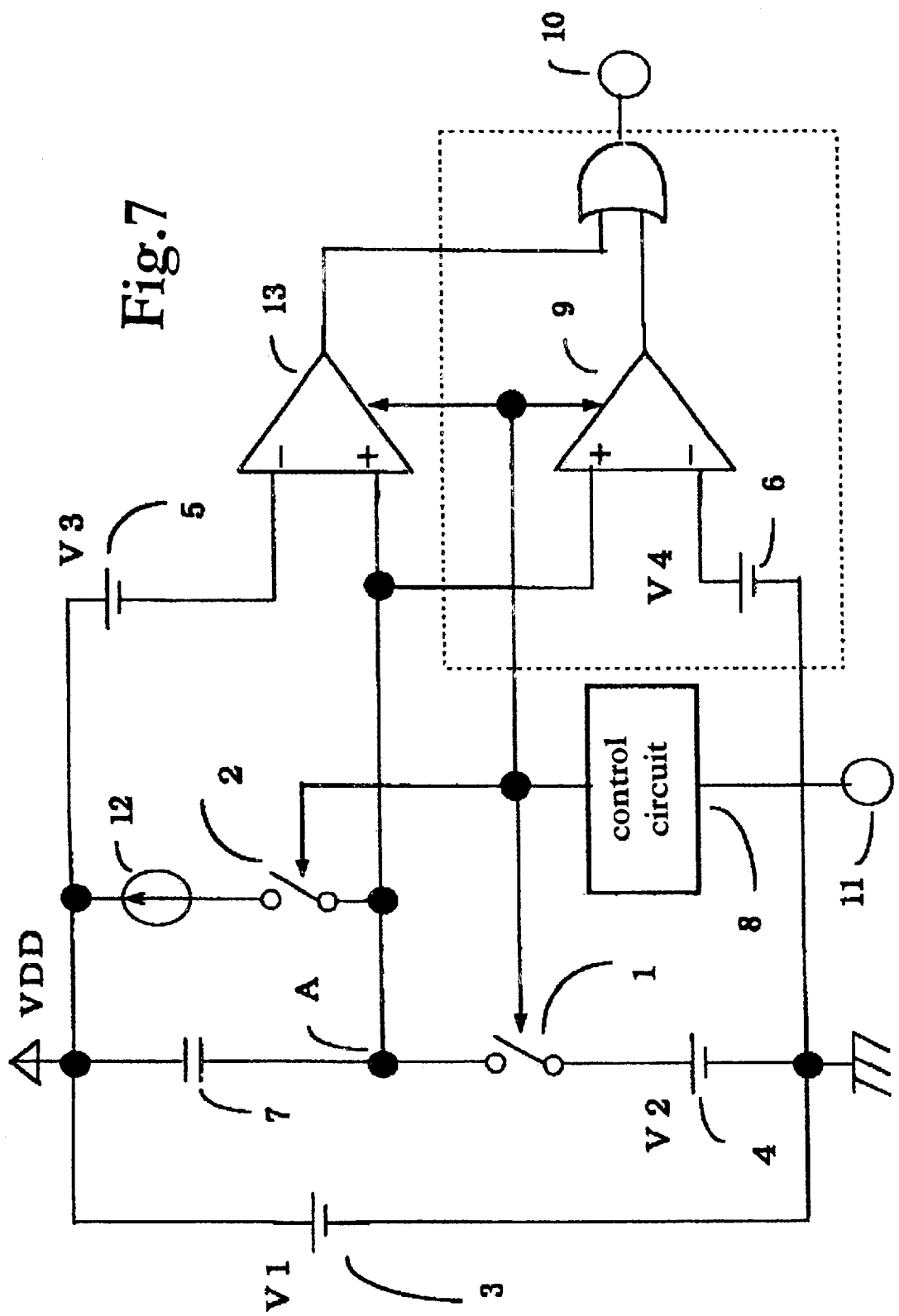
FIG. 7 is an explanatory view showing another embodiment of a delay circuit of the present invention.

Another embodiment is shown in FIG. 7. Although this circuit operates in the same way as the circuit of FIG. 1, connection of capacitance 7 and constant current source 12 is different from FIG. 1.

At an initial state, a switch 1 is turned ON (closed), and a switch 2 is turned OFF (opened). A capacitor 7 has a potential V2 of a reference voltage in advance.

Figure 8:
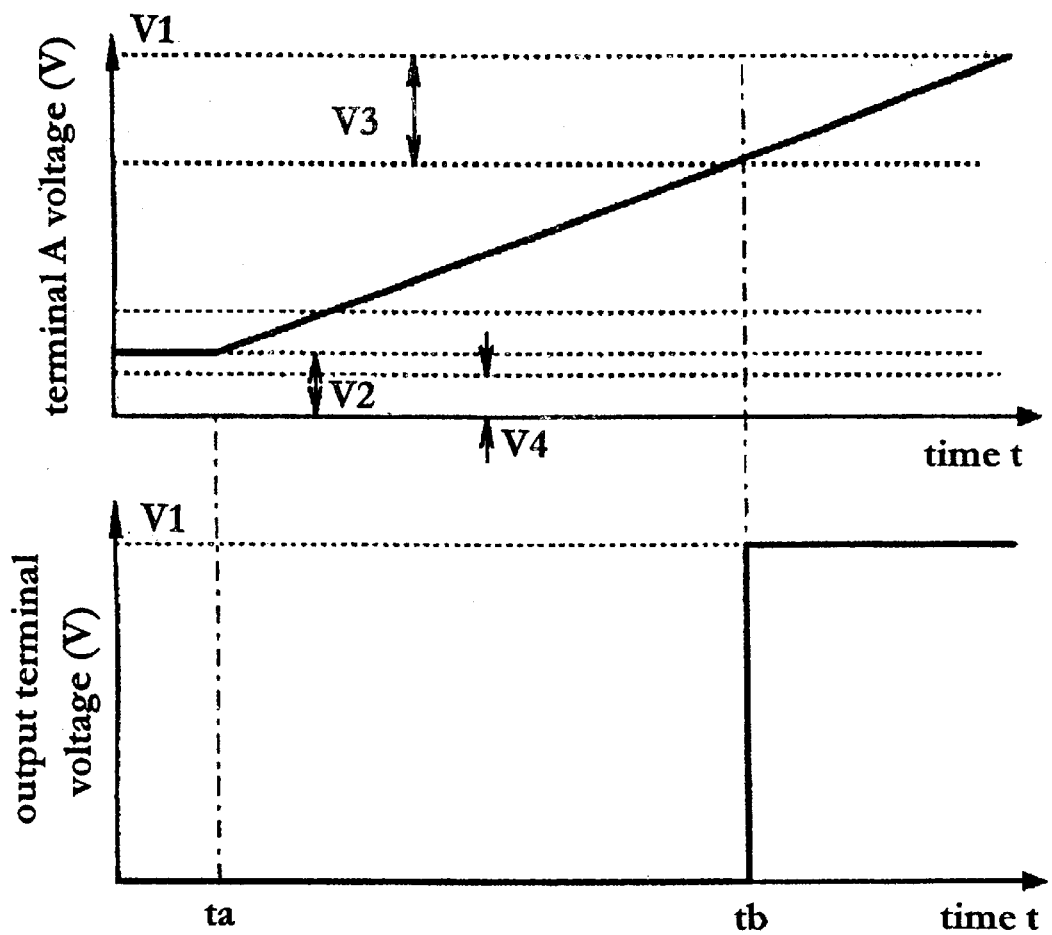
FIG. 8 is an explanatory view showing the state change of the other embodiment of the delay circuit of the present invention.

In order to start the operation of this delay circuit, a signal is given to an input terminal 11. When the signal enters the input terminal 11, a control circuit 8 turns OFF the switch 1 and turns ON the switch 2. A constant current source 12 is connected to a terminal A, and the capacitor 7 also connected to the terminal A is discharged. When the potential at the terminal A reaches a value obtained by subtracting a potential V3 of a reference voltage 5 from a potential V1 of a power source voltage, the output of a comparator 13 is inverted. The voltage changes at this time are shown in FIG. 8.

When the terminal A to which the capacitor is connected, is connected to a potential lower than V4 by an external factor or is connected to a potential higher than (V1−V3), the output of the comparator 9 or the comparator 13 is inverted in a state where there is little delay time.

In the example of FIG. 1, although the potential of the terminal A is set at the potential of (V1−V2) in advance, this potential may be any potential of V1 to the ground.

Figure 9:
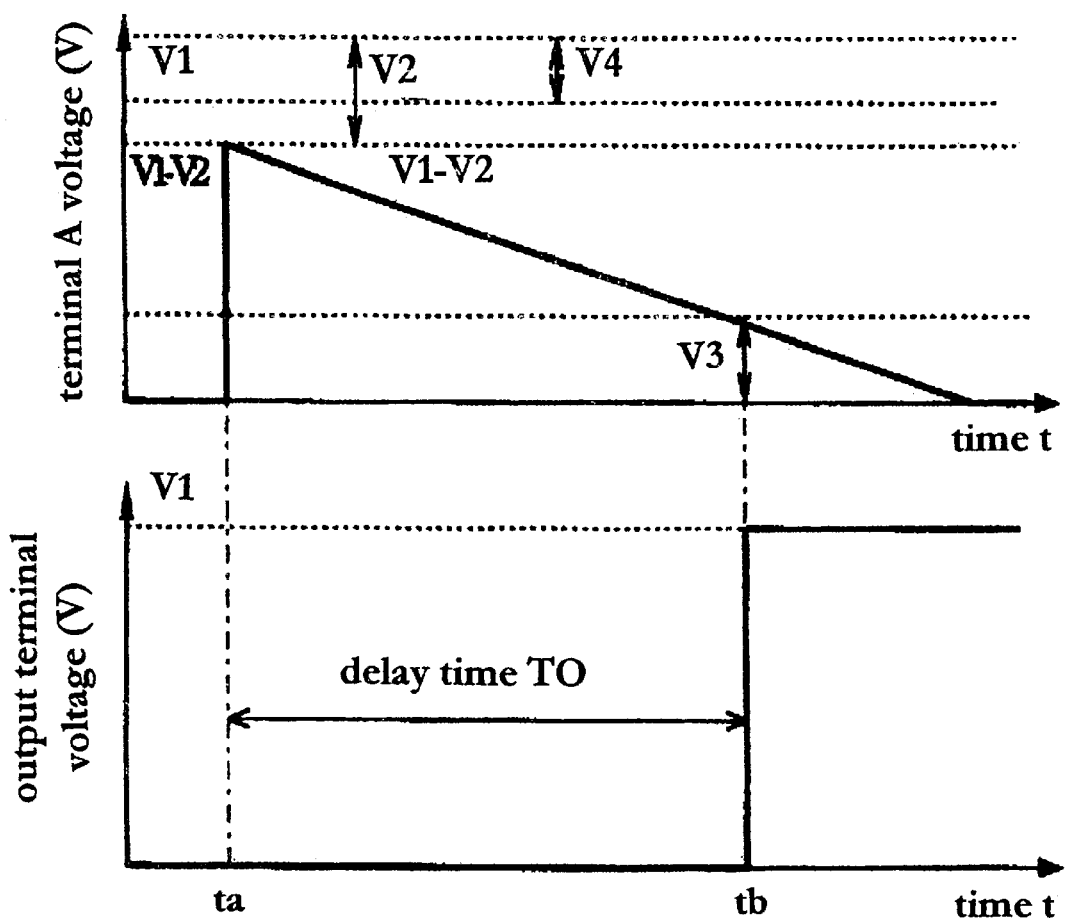
FIG. 9 is an explanatory view showing the state change of the other embodiment of the delay circuit of the present invention.

Before the voltage of the input terminal is changed, even if the potential of the capacitor is V1 or the ground potential, the present invention can be realized. This can be also explained by the circuit shown in FIG. 1. At an initial state, both the switches 1 and 2 are turned OFF. The capacitor 7 has been made to have the ground potential in advance. At this time, all of the switches 1 and 2, and the comparators 9 and 13 are turned OFF. In order to start the operation of this delay circuit, a signal is given to the input terminal 11. When the signal enters the input terminal 11, the control circuit 8 turns ON the switch 1 so that the capacitor 7 is first charged up to a potential of (V1−V2). Thereafter, the switch 1 is turned OFF, the switch 2 is turned ON, and the comparators 9 and 13 are put in an operable state. The constant current source 12 is connected to the terminal A, and the capacitor 7 also connected to the terminal A is discharged. When the potential at the terminal A reaches the potential V3 of the reference voltage 5, the output of the comparator 9 is inverted. The potential changes of the terminal A voltage and the output terminal at this time are shown in FIG. 9.

It does not matter if the potential of the capacitor at the initial stage is not VSS. That is as long as the comparator is turned OFF at the initial state, the potential of the capacitor 4 may have any state.

Although the foregoing embodiments have been described, the present invention can be carried out even if input terminals of the comparators or the output logic is assembled in any manner.

The embodiments described thus far can be constructed with a semiconductor integrated circuit. At that time, a capacitance is difficult to be assembled in the integrated circuit, and is connected to the outside. Thus, the present invention displays effectiveness.

According to the present invention, as described above, only a simple circuit is added, such an operation is made that an output potential is changed even at an abnormal time when a capacitance becomes an open state or is short-circuited to a power source voltage potential or a ground potential, so that there are effects that the reliability of the entire apparatus is increased and the safety is improved.

What is claimed is:

1. A delay circuit comprising: a first circuit for charging/discharging a capacitor to set a delay time in accordance with a capacitance value of the capacitor; and a second circuit operative when one terminal of the capacitor becomes one of short-circuited to an abnormal voltage level, open-circuited, and short-circuited to an improper wiring line to reduce the delay time.

2. A delay circuit according to claim 1; wherein the first circuit comprises a voltage source to which a first terminal of the capacitor is connected to provide a charging path for charging the capacitor, a discharging path connected to the capacitor for discharging the capacitor, and a first comparing circuit for comparing a voltage at one of the terminals of the capacitor to a first reference voltage and producing an output signal in accordance with the comparison result.

3. A delay circuit for charging/discharging a capacitor to set a delay time, comprising: a capacitor; a circuit for controlling the charging and discharging of the capacitor in accordance with an input signal; and a comparator for comparing a voltage at a first terminal of the capacitor with at least a first reference voltage and a second reference voltage higher than the first reference voltage and producing an output signal in accordance with the comparison result; wherein the circuit for controlling the charging and discharging of the capacitor comprises a voltage source to which the first terminal of the capacitor is connected to provide a charging path for charging the capacitor, and a discharging path connected to the capacitor for discharging the capacitor.

4. A delay circuit according to claim 3;
wherein the circuit for controlling the charging and discharging of the capacitor further comprises a first switch disposed between the first terminal of the capacitor and the voltage source, a second switch disposed in the discharging path for controlling the discharging of the capacitor, and a control circuit for receiving an input signal, producing a first output signal for controlling the first switch to control charging of the capacitor through the charging path in response to the input signal, and producing a second output signal for controlling the second switch to control discharging of the capacitor through the discharging path in response to the first signal.

5. A delay circuit according to claim 4; wherein the first switch is a normally closed switch and the second switch is a normally open switch, such that the capacitor is normally maintained in a charged state, and the control circuit is responsive to the input signal to open the first switch and close the second switch so that the capacitor discharges through the discharging path and an output signal of the comparing circuit has a transition point at the delay time.

6. A delay circuit comprising:
a first circuit for charging/discharging a capacitor to set a delay time in accordance with a capacitance value of the capacitor and having a voltage source to which a first terminal of the capacitor is connected to provide a charging path for charging the capacitor, a discharging path connected to the capacitor for discharging the capacitor, and a first comparing circuit for comparing a voltage at one of the terminals of the capacitor to a first reference voltage and producing an output signal in accordance with the comparison result;
a second circuit operative when one terminal of the capacitor becomes one of short-circuited to an abnormal voltage level, open-circuited, and short-circuited to an improper wiring line to reduce the delay time;
a first switch disposed between the first terminal of the capacitor and the voltage source for controlling the charging of the capacitor;
a second switch disposed in the discharging path for controlling the discharging of the capacitor; and
a control circuit for receiving an input signal, producing a first output signal for controlling the first switch to control charging of the capacitor through the charging path in response to the input signal, and producing a second output signal for controlling the second switch to control discharging of the capacitor through the discharging path in response to the input signal.

7. A delay circuit according to claim 6; wherein the first switch is a normally closed switch and the second switch is a normally open switch, such that the capacitor is normally maintained in a charged state, and the control circuit is responsive to the input signal to open the first switch and close the second switch so that the capacitor discharges through the discharging path and the first comparing circuit produces an output signal having a transition point at the delay time.

8. A delay circuit according to claim 7; wherein the second circuit comprises a second comparing circuit for comparing a voltage at one of the terminals of the capacitor to a second reference voltage higher than the first reference voltage and producing an output signal in accordance with the comparison result.

9. A delay circuit according to claim 8; wherein the second circuit further comprises a logic circuit for receiving output signals of the first and second comparing circuits and producing an output signal in accordance therewith.

10. A delay circuit according to claim 9; wherein the second comparing circuit produces an output signal having a predetermined level when the voltage at the one of the terminals of the capacitor is above the second reference voltage and the logic circuit outputs a signal having the predetermined level when the output signal of either of the first and second comparing circuits has the predetermined level.

11. A delay circuit according to claim 10; wherein the logic circuit comprises an OR gate.

12. A delay circuit according to claim 8; wherein the second reference voltage is set at a value higher than the first reference voltage so that when a terminal of the capacitor becomes short-circuited to an abnormal voltage level the second comparing circuit produces an output signal effective to reduce the delay time.

13. A delay circuit comprising: a capacitor; a charging/discharging control circuit receptive of an input signal for controlling at least one of the charging and the discharging of the capacitor to set a predetermined delay time in accordance with a capacitance value of the capacitor; and a comparing circuit for comparing a voltage at a first terminal of the capacitor with a first reference voltage to produce an output signal having a transition point after the predetermined delay time has elapsed during one of charging and discharging of the capacitor, and comparing a voltage at the first terminal of the capacitor with a second reference and producing an output signal when the voltage at the first terminal of the capacitor is higher than the second reference voltage so that the delay time is reduced when the first terminal of the capacitor becomes short-circuited to an abnormally high voltage level.

14. A delay circuit according to claim 13; wherein the charging/discharging control circuit comprises a voltage source to which the first terminal of the capacitor is connected to provide a charging path for charging the capacitor, and a discharging path connected to the capacitor for discharging the capacitor.

15. A delay circuit according to claim 14; wherein the charging/discharging control circuit further comprises a first switch disposed between the first terminal of the capacitor and the voltage source, a second switch disposed in the discharging path for controlling the discharging of the capacitor, and a control circuit for receiving an input signal, producing a first output signal for controlling the first switch to control charging of the capacitor through the charging path, and producing a second output signal for controlling the second switch to control discharging of the capacitor through the discharging path.

16. A delay circuit according to claim 15; wherein the first switch is a normally closed switch and the second switch is a normally open switch, such that the capacitor is normally maintained in a charged state, and the control circuit is responsive to the input signal to open the first switch and close the second switch so that the capacitor discharges through the discharging path and a level of an output signal of the comparing circuit has a transition point after the predetermined delay time.

17. A delay circuit according to claim 16; wherein the comparing circuit comprises a first comparing circuit for comparing a voltage at the first terminal of the capacitor to a first reference voltage and producing a first output signal in accordance with the comparison result and a second comparing circuit for comparing the voltage at the first terminal of the capacitor to a second reference voltage higher than the reference voltage and producing a second output signal in accordance with the comparison result.

18. A delay circuit according to claim 16; wherein the second circuit further comprises a logic circuit for receiving the first and second output signals of the first and second comparing circuits and producing an output signal in accordance therewith.

19. A delay circuit according to claim 13; wherein the output signal of the comparing circuit becomes inverted in level when the voltage at the first terminal of the capacitor crosses over either of the first and second reference voltages.

* * * * *